(12) United States Patent
Chiou et al.

(10) Patent No.: US 12,315,837 B2
(45) Date of Patent: May 27, 2025

(54) STORAGE LAYERS FOR WAFER BONDING

(71) Applicant: Taiwan Semiconductor Manufacturing Company, Ltd., Hsinchu (TW)

(72) Inventors: De-Yang Chiou, Hsinchu (TW); Yu-Yun Peng, Hsinchu (TW); Fu-Ting Yen, Hsinchu (TW); Keng-Chu Lin, Pingtung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/447,968

(22) Filed: Aug. 10, 2023

(65) Prior Publication Data

US 2023/0387065 A1 Nov. 30, 2023

Related U.S. Application Data

(62) Division of application No. 17/459,496, filed on Aug. 27, 2021, now Pat. No. 11,942,447.

(51) Int. Cl.
| | |
|---|---|
| *H01L 23/48* | (2006.01) |
| *H01L 23/00* | (2006.01) |
| *H01L 25/00* | (2006.01) |
| *H01L 25/065* | (2023.01) |

(52) U.S. Cl.
CPC .......... *H01L 24/32* (2013.01); *H01L 23/481* (2013.01); *H01L 24/29* (2013.01); *H01L 24/83* (2013.01); *H01L 25/0657* (2013.01); *H01L 25/50* (2013.01); *H01L 2224/29188* (2013.01); *H01L 2224/32145* (2013.01); *H01L 2224/83013* (2013.01); *H01L 2224/83896* (2013.01); *H01L 2225/06541* (2013.01); *H01L 2924/05042* (2013.01); *H01L 2924/05442* (2013.01); *H01L 2924/3512* (2013.01)

(58) Field of Classification Search
CPC .................. H01L 24/83; H01L 23/481; H01L 2224/32145
See application file for complete search history.

(56) References Cited

U.S. PATENT DOCUMENTS

| | | | |
|---|---|---|---|
| 5,985,771 A | 11/1999 | Moore et al. | |
| 6,821,571 B2 * | 11/2004 | Huang | C23C 16/325 427/535 |
| 9,406,523 B2 * | 8/2016 | Chen | H01L 21/32139 |
| 9,627,365 B1 * | 4/2017 | Yu | H01L 23/5389 |
| 2006/0138627 A1 | 6/2006 | Shaheen et al. | |
| 2016/0144593 A1 | 5/2016 | Jungwirth | |
| 2021/0188649 A1 | 6/2021 | Mu et al. | |
| 2023/0062412 A1 | 3/2023 | Chiou et al. | |

* cited by examiner

*Primary Examiner* — Dale E Page
*Assistant Examiner* — Wilner Jean Baptiste
(74) *Attorney, Agent, or Firm* — Sterne, Kessler, Goldstein & Fox P.L.L.C.

(57) ABSTRACT

The present disclosure describes a semiconductor structure having bonded wafers with storage layers and a method to bond wafers with storage layers. The semiconductor structure includes a first wafer including a first storage layer with carbon, a second wafer including a second storage layer with carbon, and a bonding layer interposed between the first and second wafers and in contact with the first and second storage layers.

20 Claims, 13 Drawing Sheets

STORAGE LAYERS FOR WAFER BONDING

CROSS-REFERENCE TO RELATED APPLICATION

This application is a divisional application of U.S. patent application Ser. No. 17/459,496, filed on Aug. 27, 2021, titled "Storage Layers for Wafer Bonding," the disclosure of which is incorporated herein by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down allows more semiconductor devices to be integrated into a given area but increases the complexity of semiconductor manufacturing processes.

BRIEF DESCRIPTION OF THE DRAWINGS

Aspects of the present disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1A:
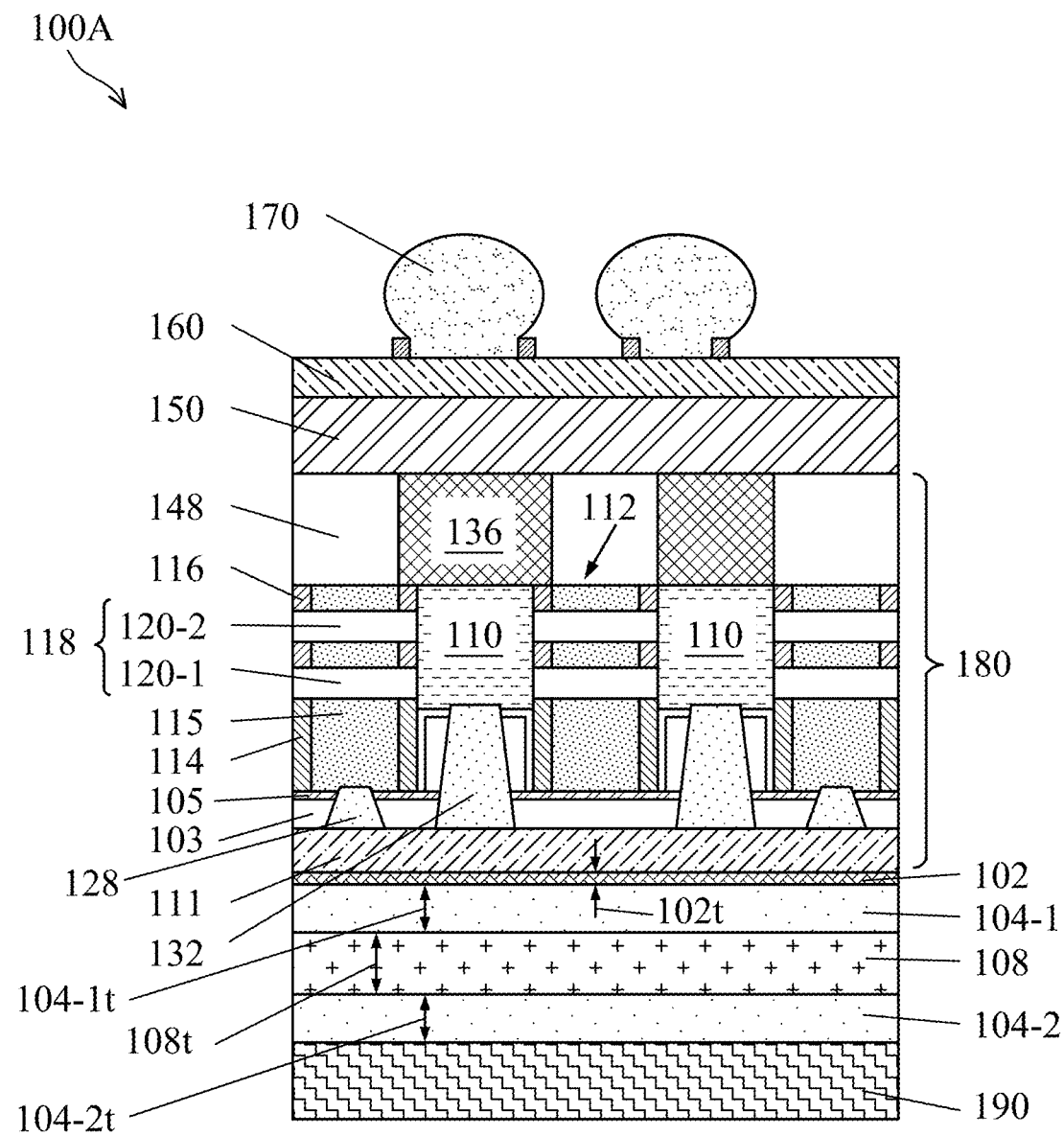
FIGS. 1A-1C illustrate bonded structures having a first wafer bonded to a second wafer, where the first and second wafers have storage layers disposed thereon, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

With the continuous scaling down of semiconductor devices, three-dimensional (3D) integrated circuits (ICs) are developed to resolve the limitations of the number and length of interconnections between semiconductor devices as the number of semiconductor devices increases. The development of 3D IC requires improvements of wafer bonding. In wafer bonding, two semiconductor wafers are bonded together to form a three dimensional structure without the need for an intervening substrate or device. A bonding layer, such as silicon oxide, can be formed on each semiconductor wafer. One semiconductor wafer can be flipped and placed on top of the other semiconductor wafer, with the bonding layers of these two semiconductor wafers in contact. After a bonding anneal, silicon-oxygen-silicon (Si—O—Si) bonds can form at the interface of the bonding layers and can bond the two semiconductor wafers together. This bonding process can be referred to as "wafer fusion bonding." However, during the bonding anneal, water vapor ($H_2O$) and hydrogen ($H_2$) byproducts can form at the interface of the bonding layer. With large quantities of water vapor and hydrogen formed at the interface of the bonding layers, bubbles can form around the interface, which can create stress and cause wafer cracking issues. In some embodiments, about 30% to about 80% of the bonded structures can have wafer cracking issues.

Various embodiments in the present disclosure provide example methods for forming bonded structures using storage layers and example bonded structures fabricated with the same methods. According to some embodiments, the storage layers can store the water vapor and hydrogen byproducts generated during the bonding anneal, thereby reducing wafer cracking issues. In some embodiments, the storage layers can include a carbon-containing porous material to store the water vapor and hydrogen byproducts. The carbon concentration in the storage layers can range from about 5% to about 25%. In some embodiments, the storage layers can further include nitrogen to act as an etch stop layer for subsequent processes. The nitrogen concentration in the storage layers can range from about 7% to about 15%. In some embodiments, the storage layers can include silicon, oxygen, carbon, and nitrogen. And the dielectric constant of the storage layers can be adjusted by tuning the oxygen concentration and/or the carbon concentration. In some embodiments, the storage layers can reduce the percentage of wafer cracking issues for bonded structures to less than about 5%.

Figure 1B:
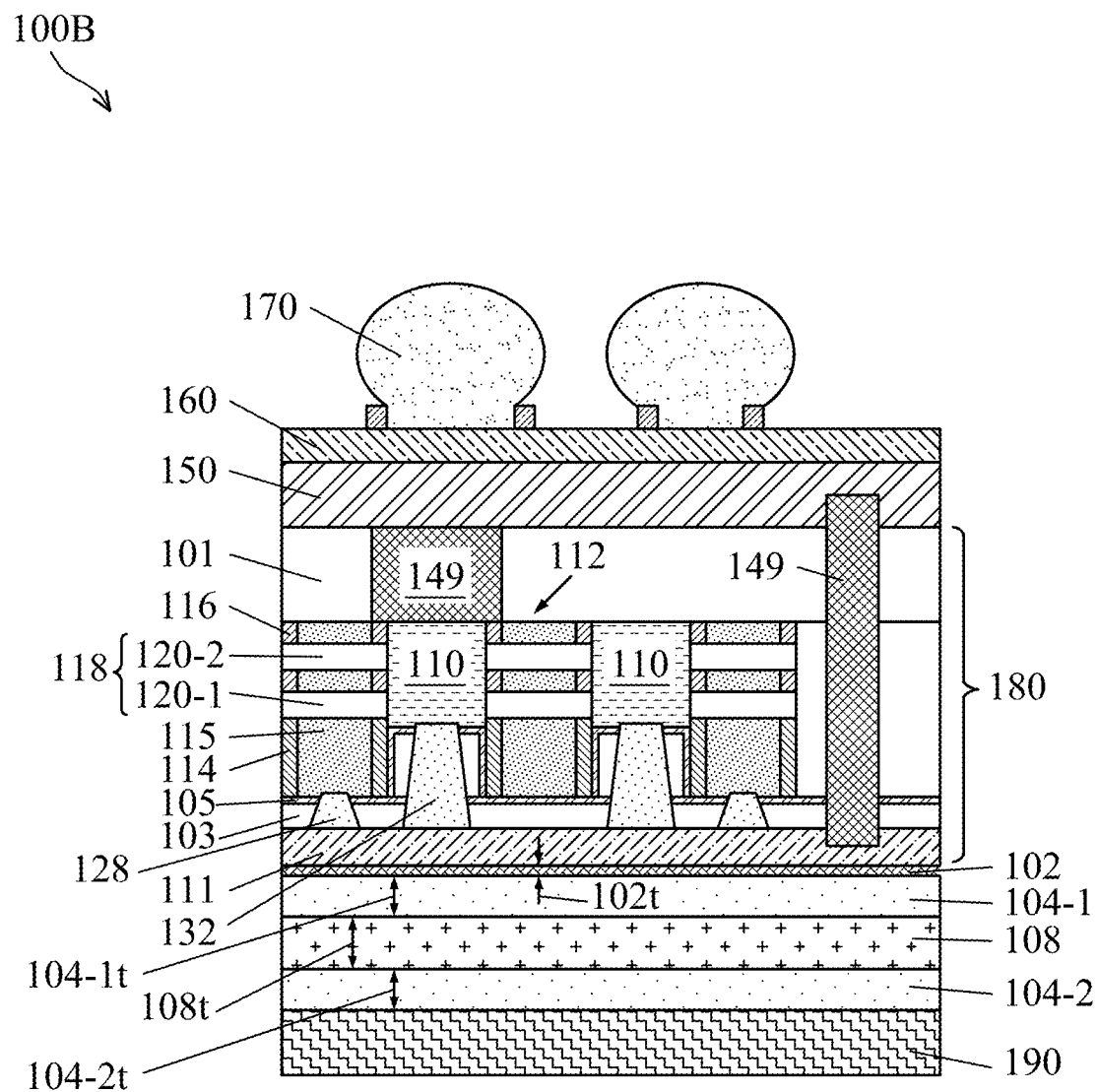
Figure 1C:
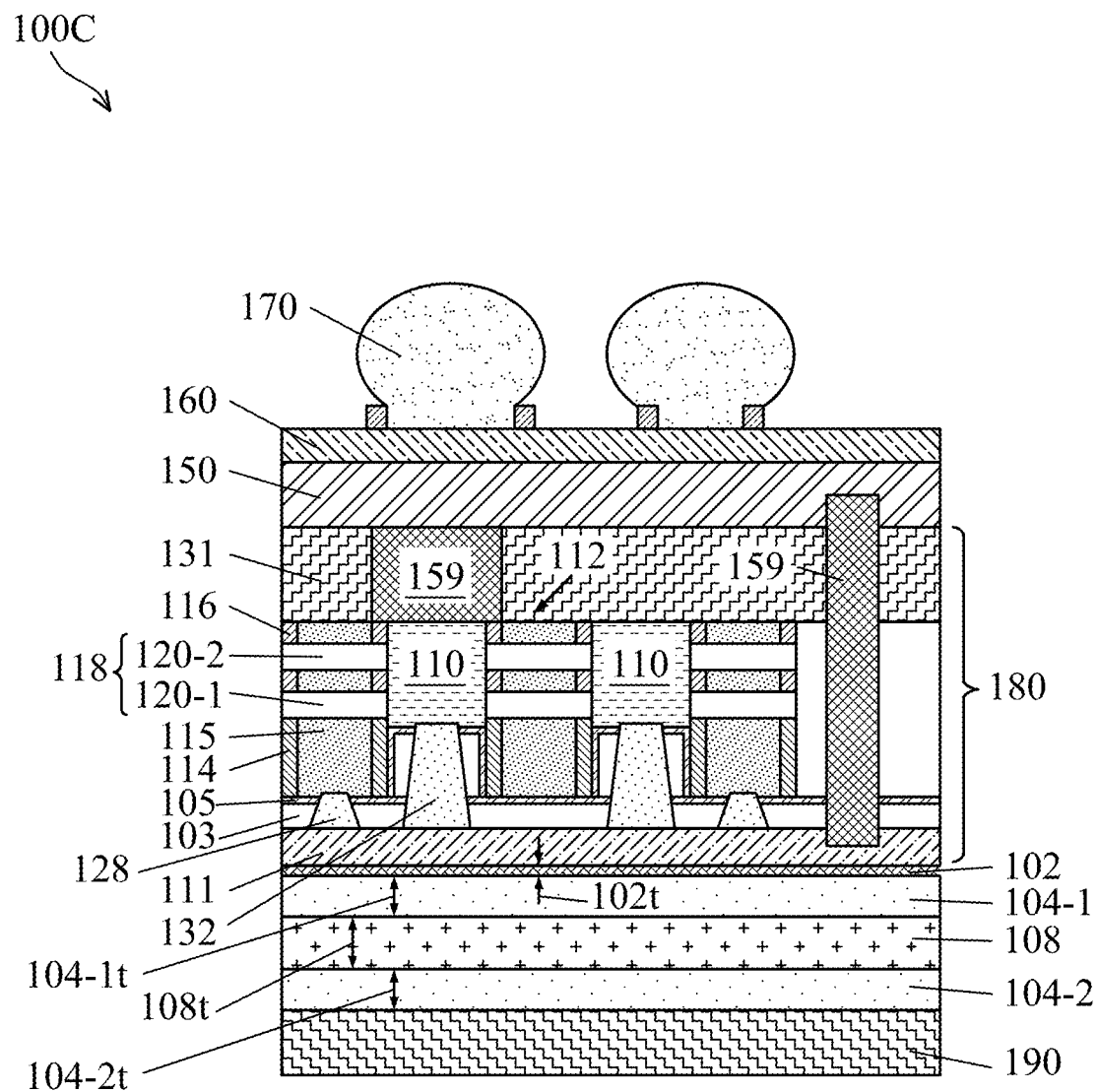

FIGS. 1A-1C illustrate respective bonded structures 100A-100C having a first wafer 180 bonded to a second wafer 190 with storage layers 104-1 and 104-2, in accordance with some embodiments. In some embodiments, first wafer 180 can be a device wafer having one or more semiconductor devices 112 formed on a substrate and second wafer 190 can be a carrier wafer having a substrate, as shown in FIGS. 1A-1C. In some embodiments, the substrate of the carrier wafer can be thinned down to a thickness less than about 775 μm. In some embodiments, the substrate of the carrier wafer may not be thinned down. In some embodiments, as shown in FIG. 1A, bonded structure 100A can include backside source/drain (S/D) contact structures 136 connected to S/D epitaxial structures 110. In some embodiments, as shown in FIG. 1B, bonded structure 100B can include through-silicon vias (TSV) 149 connected to S/D epitaxial structures 110. In some embodiments, as shown in FIG. 1C, bonded structure 100C can include through-oxide vias (TOV) 159 connected to S/D epitaxial structures 110. In some embodiments, first wafer 180 can be a device wafer or carrier wafer, and second wafer 190 can be a device wafer or a carrier wafer. Referring to FIGS. 1A-1C, bonded structures 100A-100C can further include a protective layer 102 on first wafer 180 and a bonding layer 108 bonding first wafer 180 and second wafer 190.

Referring to FIG. 1A, first wafer 180 can include one or more semiconductor devices 112, such as MOSFETs, finFETs, and gate-all-around (GAA) FETs. One or more semiconductor devices 112 can include fin structures 118, S/D epitaxial structures 110, gate structures 115, gate spacers 114, and inner spacer structures 116. In some embodiments, fin structures 118 can include semiconductor layers 120-1 and 120-2 (collectively referred to as "semiconductor layers 120"), as shown in FIG. 1A. Gate structures 115 can be connected to interconnect layer 111 through gate contact structures 128. S/D epitaxial structures 110 can be connected to interconnect layer 111 through front-side S/D contact structure 132. S/D epitaxial structure 110 can be connected to a backside metal routing layer 150 through backside S/D contact structures 136. Backside inter-layer dielectric (ILD) layer 148 can isolate backside S/D contact structures 136 from adjacent structures. Backside metal routing layer 150 can be connected to a backside metal contact layer 160 and bump contacts 170. First wafer 180 can further include other active devices, passive devices, and interconnections to connect one or more semiconductor devices 112.

One or more semiconductor devices 112 can be formed on substrate 101 of first wafer 180, as shown in FIG. 1A. Substrate 101 can include a semiconductor material, such as silicon. In some embodiments, substrate 101 includes a crystalline silicon substrate (e.g., wafer). In some embodiments, substrate 101 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; (iv) a semiconductor on insulator including silicon on insulator (SOI); or (v) a combination thereof. Further, substrate 101 can be doped depending on design requirements (e.g., p-type substrate or n-type substrate). In some embodiments, substrate 101 can be doped with p-type dopants (e.g., boron, indium, aluminum, or gallium) or n-type dopants (e.g., phosphorus or arsenic). In some embodiments, second wafer 190 can include a substrate having a semiconductor material similar to first wafer 180. In some embodiments, the substrate of second wafer 190 can have a semiconductor material the same as or different from the semiconductor material of the substrate of first wafer 180.

One or more semiconductor devices 112 can be disposed adjacent to protective layer 102. Protective layer 102 can be disposed on first wafer 180 to protect one or more semiconductor devices 112 on first wafer 180. In some embodiments, protective layer 102 can include a dielectric material, such as silicon nitride ($SiN_x$), silicon oxide ($SiO_x$), silicon oxynitride (SiON), silicon carbide (SiC), silicon carbo-nitride (SiCN), boron nitride (BN), silicon boron nitride (SiBN), silicon carbon boron nitride (SiCBN), and a combination thereof. In some embodiments, protective layer 102 can include silicon nitride or silicon oxide formed by atomic layer deposition (ALD), low pressure chemical vapor deposition (LPCVD), plasma enhanced chemical vapor deposition (PECVD), or chemical vapor deposition (CVD). In some embodiments, protective layer 102 can have a vertical dimension 102$t$ (e.g., thickness) along a Z-axis direction ranging from about 1 nm to about 20 nm. Protective layer 102 can be configured to protect one or more semiconductor devices 112 on first wafer 180 from damages (e.g., oxidation) in subsequent processes. This protection can be provided, for example, during formation of storage layer 104-1. If vertical dimension 102$t$ is less than about 1 nm, protective layer 102 may not protect the semiconductor devices on first wafer 180. If vertical dimension 102$t$ is greater than about 20 nm, protective layer 102 may affect the heat dispassion of the semiconductor devices on bonded structure 100A.

Referring to FIG. 1A, storage layer 104-1 can be disposed on first wafer 180 and storage layer 104-2 can be disposed on second wafer 190. In some embodiments, storage layers 104-1 and 104-2 (collectively referred to as "storage layers 104") can include a carbon-containing porous material to store water vapor and hydrogen byproducts generated during the bonding anneal. The carbon concentration in storage layers 104 can be controlled by an annealing temperature of an anneal process after deposition of the porous material. The higher the carbon concentration is, the higher the porosity of storage layers 104 is, and the lower the density of storage layers 104 is. In some embodiments, the carbon concentration in storage layers 104 can range from about 5% to about 25% and the density of storage layers 104 can range from about 1.6 g/cm³ to about 2.3 g/cm³. If the carbon concentration is less than about 5%, the density of storage layers 104 may be greater than 2.3 g/cm³ and may not be able to store the water vapor and hydrogen byproducts. If the carbon concentration is greater than about 25%, the density of storage layers 104 may be less than 1.6 g/cm³ and storage layers 104 may have lower quality and may peel off during a substrate thinning down process of bonded structure 100A.

In some embodiments, storage layers 104 can further include nitrogen ranging from about 0% to about 15%. The nitrogen concentration in storage layers 104 can be controlled by a flow rate of a nitrogen-containing gas and a process temperature during deposition of the carbon-containing porous material. In some embodiments, the nitrogen concentration in the storage layers 104 can range from about 7% to about 15%. Nitrogen in storage layers 104 can increase etch resistance of storage layers 104 and act as an etch stop layer in subsequent processes. If the nitrogen concentration is less than about 7%, the etch selectivity between storage layers 104 and adjacent structures may be reduced. If the nitrogen concentration is greater than about 15%, storage layers 104 may have lower carbon concentration and storage layers 104 may not be able to store the water vapor and hydrogen byproducts.

In some embodiments, storage layers 104 can be a porous material including silicon, oxygen, carbon, and nitrogen. The dielectric constant of storage layers 104 can be reduced by increasing the oxygen concentration and/or increasing the carbon concentration of storage layers 104. Lower dielectric constant can reduce parasitic capacitance and improve device performance. The oxygen concentration of storage layers 104 can be controlled by a ratio of oxygen and nitrogen-containing gases during an anneal process after deposition of the porous material. The carbon concentration can be controlled by the annealing temperature of the anneal process. In some embodiments, the dielectric constant of storage layers 104 can range from about 3.7 to about 4.3.

In some embodiments, storage layers 104 can store the water vapor and hydrogen byproducts generated during the bonding anneal and reduce stress across bonded structure 100A. As a result, storage layers 104 can reduce the percentage of wafer cracking issues for bonded structures 100 Compared to bonded structures without storage layers, bonded structure 100A with storage layers 104 can reduce wafer cracking issues from a percentage of about 30% to about 80% to a percentage of about 5% to about 25%. The decrease of wafer cracking issues can increase device performance and the yield of bonded structures 100 with storage layers.

In some embodiments, storage layer 104-1 can have a vertical dimension 104-1t (e.g., thickness) along a Z-axis ranging from about 20 nm to about 150 nm. In some embodiments, storage layer 104-2 can have a vertical dimension 104-2t (e.g., thickness) along a Z-axis ranging from about 5 nm to about 150 nm. If vertical dimension 104-1t is less than about 20 nm, or vertical dimension 104-2t is less than about 5 nm, storage layers 104 may not store the water vapor and hydrogen byproducts generated during the bonding anneal and the bonded structures may have wafer cracking issues. If vertical dimension 104-1t is greater than about 150 nm, or vertical dimension 104-2t is greater than about 150 nm, storage layers 104 may affect heat dissipation of the semiconductor devices on bonded structure 100A. In some embodiments, first wafer 180 can be a device wafer with semiconductor devices and second wafer 190 can be a carrier wafer with no semiconductor devices. Therefore storage layer 104-2 of second wafer 190 can be thinner than storage layer 104-1 of first wafer 180 for improved heat dissipation.

Referring to FIG. 1A, bonding layer 108 can be in contact with storage layers 104 and bond first wafer 180 and second wafer 190. In some embodiments, bonding layer 108 can include a dielectric material, such as silicon oxide (SiO$_x$), silicon hydroxide (SiOH), silicon oxynitride (SiON), silicon nitride (SiN$_x$), silicon oxycarbide (SiOC), silicon oxynitricarbide (SiOCN), and a combination thereof. The dielectric material can bond first wafer 180 and second wafer 190. The dielectric material can generate water vapor and hydrogen byproducts generated during the bonding anneal. The generated water vapor and hydrogen byproducts can be stored by storage layers 104. In some embodiments, bonding layer 108 can have a vertical dimension 108t (e.g., thickness) along a Z-axis ranging from about 5 nm to about 100,000 nm. If vertical dimension 108t is less than about 5 nm, first wafer 180 and second wafer 190 may not be stably bonded together. If vertical dimension 108t is greater than about 100,000 nm, bonding layer 108 may affect heat dissipation of semiconductor devices on bonded structure 100A. In some embodiments, a ratio of vertical dimension 104-1t or 104-2t to vertical dimension 108t can range from about 0.01 to about 5. If the ratio is less than about 0.01, storage layers 104 may not store the water vapor and hydrogen byproducts generated during the bonding anneal and the bonded structures may have wafer cracking issues. If the ratio is greater than about 5, storage layers 104 may affect heat dissipation of the semiconductor devices on bonded structure 100A.

Referring to FIG. 1A, bonded structure 100A can further include interconnect layer 111 connected to one or more semiconductor devices 112. Interconnect layer 111 can include one or more layers of metal vias and metal lines disposed on interlayer dielectric (ILD) layers 103. In some embodiments, the metal vias and the metal lines can include aluminum (Al), titanium nitride (TiN), tantalum nitride (TaN), tungsten (W), copper (Cu), and other suitable conductive materials. In some embodiments, ILD layers 103 can include a dielectric material deposited using a deposition method suitable for flowable dielectric materials. For example, flowable silicon oxide can be deposited using flowable chemical vapor deposition (FCVD). Referring to FIG. 1A, etch stop layers (ESL) 105 can be disposed between adjacent ILD layers 103. In some embodiments, ESL 105 can include, for example, silicon nitride (SiN$_x$), silicon oxide (SiO$_x$), silicon oxynitride (SiON), silicon carbide (SiC), silicon carbo-nitride (SiCN), or other suitable dielectric materials. In some embodiments, ESL 105 can protect underlying layers during the formation of the metal vias and the metal lines.

Referring to FIG. 1A, each of semiconductor layers 120 in fin structures 118 can form a channel region underlying gate structures 115 of one or more semiconductor devices 112. S/D epitaxial structures 110 can function as source/drain regions of one or more semiconductor devices 112. Inner spacer structures 116 can isolate gate structures 115 and S/D epitaxial structures 110. In some embodiments, gate structures 115 can include gate dielectric layers and gate electrodes. In some embodiments, backside S/D contact structures 136 can connect S/D epitaxial structures 110 to backside metal routing layer 150 and other parts of bonded structure 100A.

In some embodiments, as shown in FIG. 1B, bonded structures 100B can have first wafer 180 bonded to second wafer 190 by bonding layer 108 and storage layers 104-1 and 104-2. TSV 149 can extend through substrate 101 and connect S/D epitaxial structures 110 of one or more semiconductor devices 112 to backside metal routing layer 150 and other parts of bonded structure 100B. In some embodiments, TSV 149 can include a dielectric layer coated on the surface of TSV 149 to protect TSV 149. In some embodiments, as shown in FIG. 1C, bonded structures 100C can have first wafer 180 bonded to second wafer 190 by bonding layer 108 and storage layers 104-1 and 104-2. TOV 159 can extend through oxide layer 131 and connect S/D epitaxial structures 110 of one or more semiconductor devices 112 to backside metal routing layer 150 and other parts of bonded structure 100C. In some embodiments, TOV 159 can include a dielectric layer coated on the surface of TOV 159 to protect TOV 159. In some embodiments, oxide layer 131 can include dielectric materials such as silicon oxide.

Figure 2A:
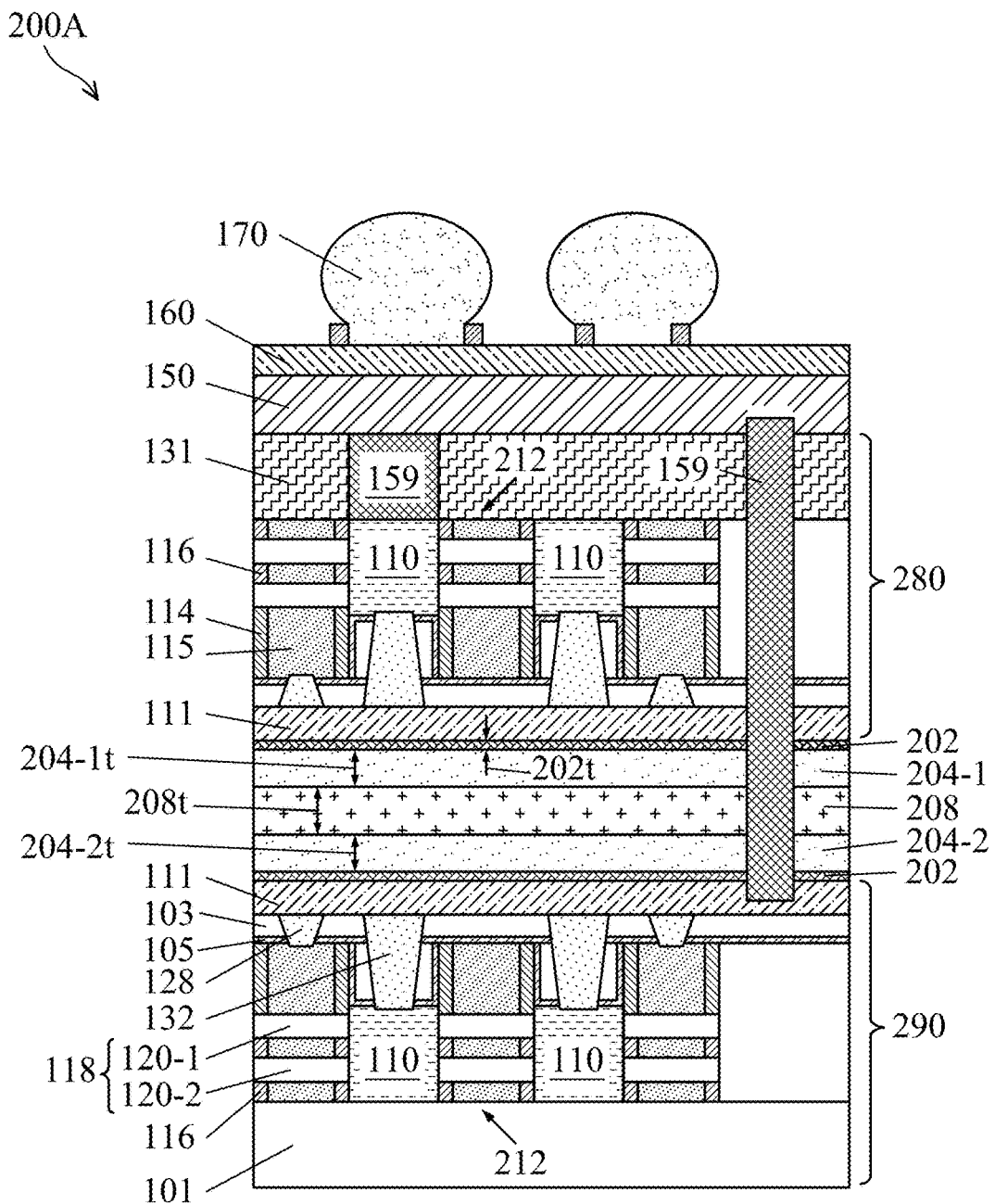
FIGS. 2A-2E illustrate other bonded structures having a first wafer bonded to a second wafer, where the first and second wafers have storage layers disposed thereon, in accordance with some embodiments.
Figure 2B:
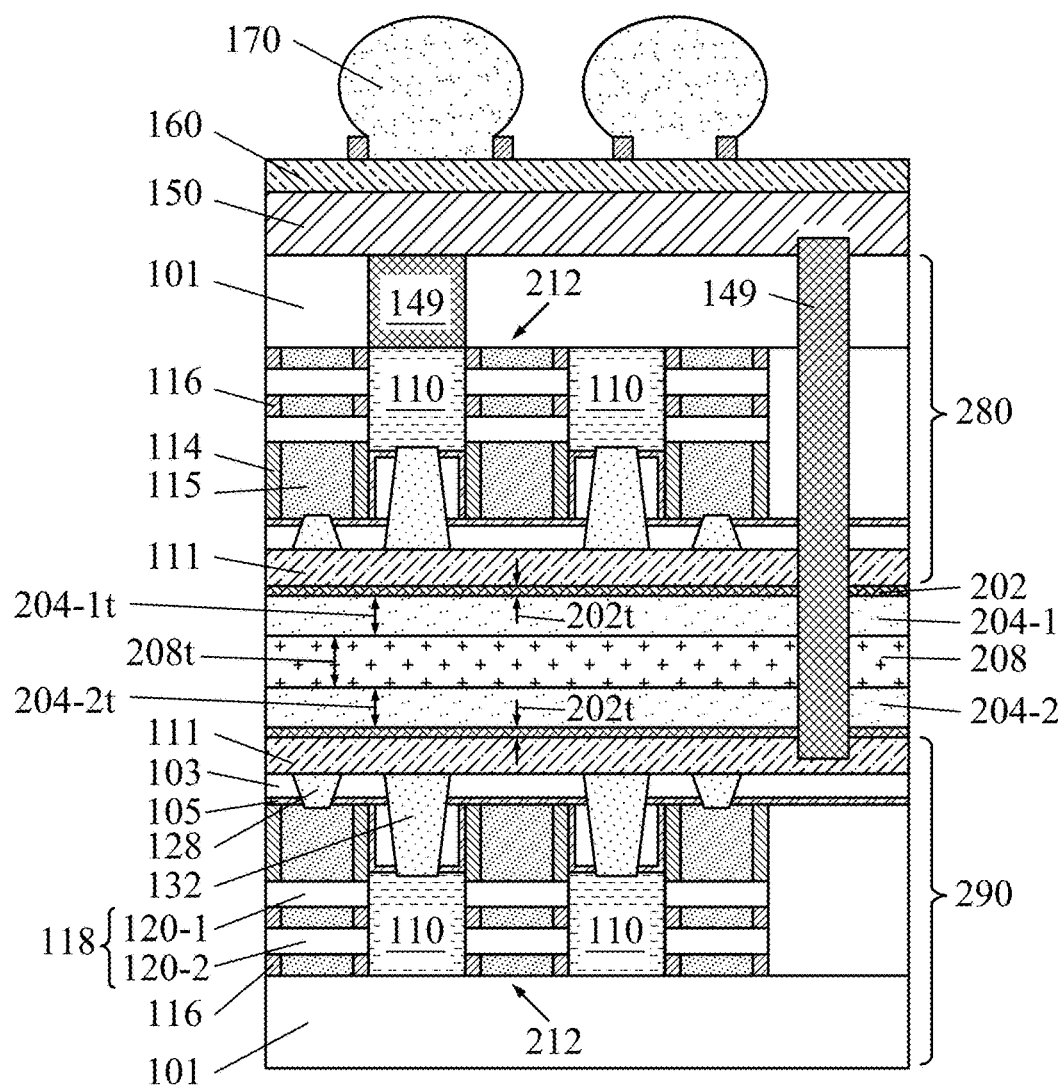
Figure 2C:
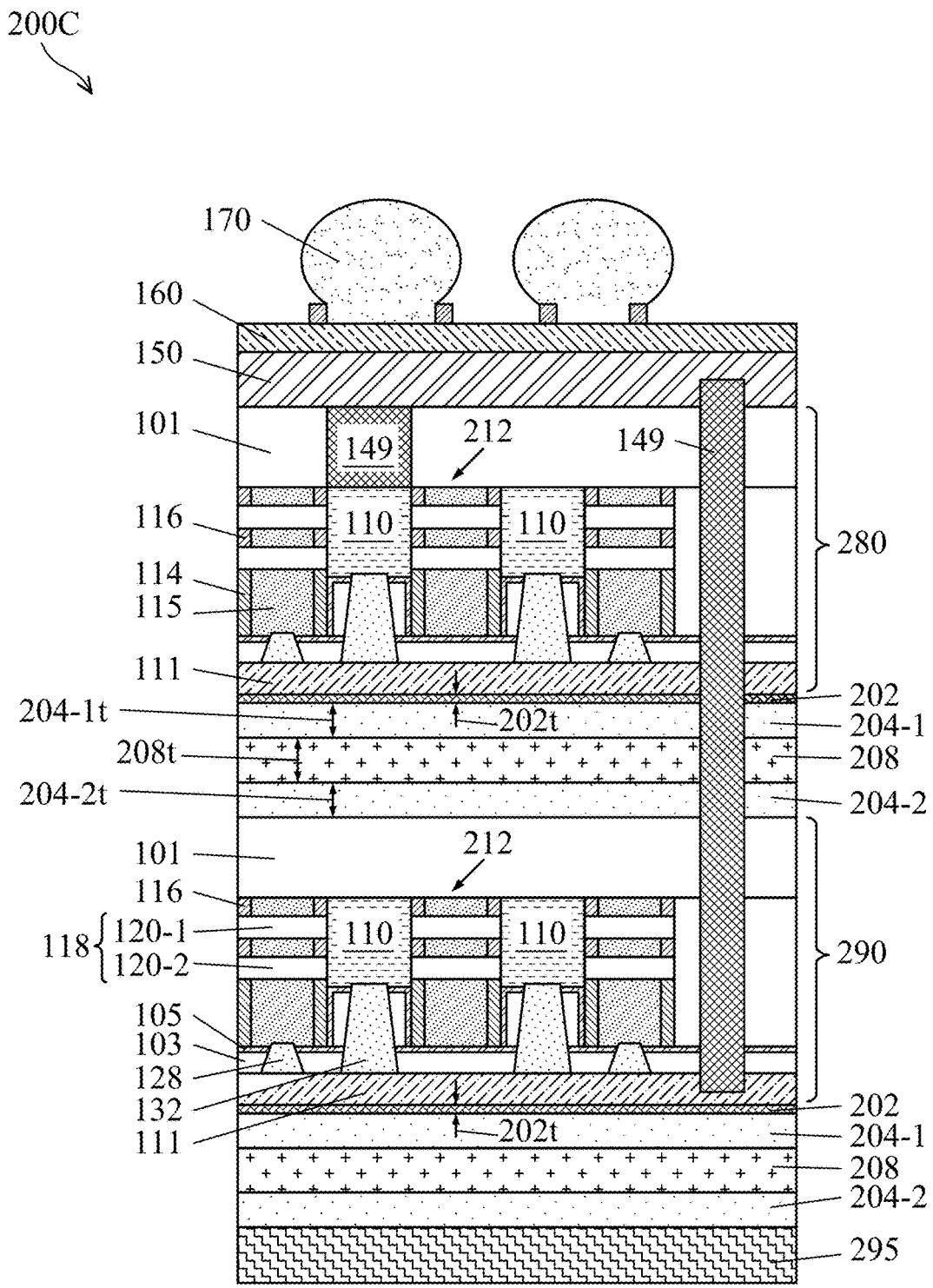
Figure 2D:
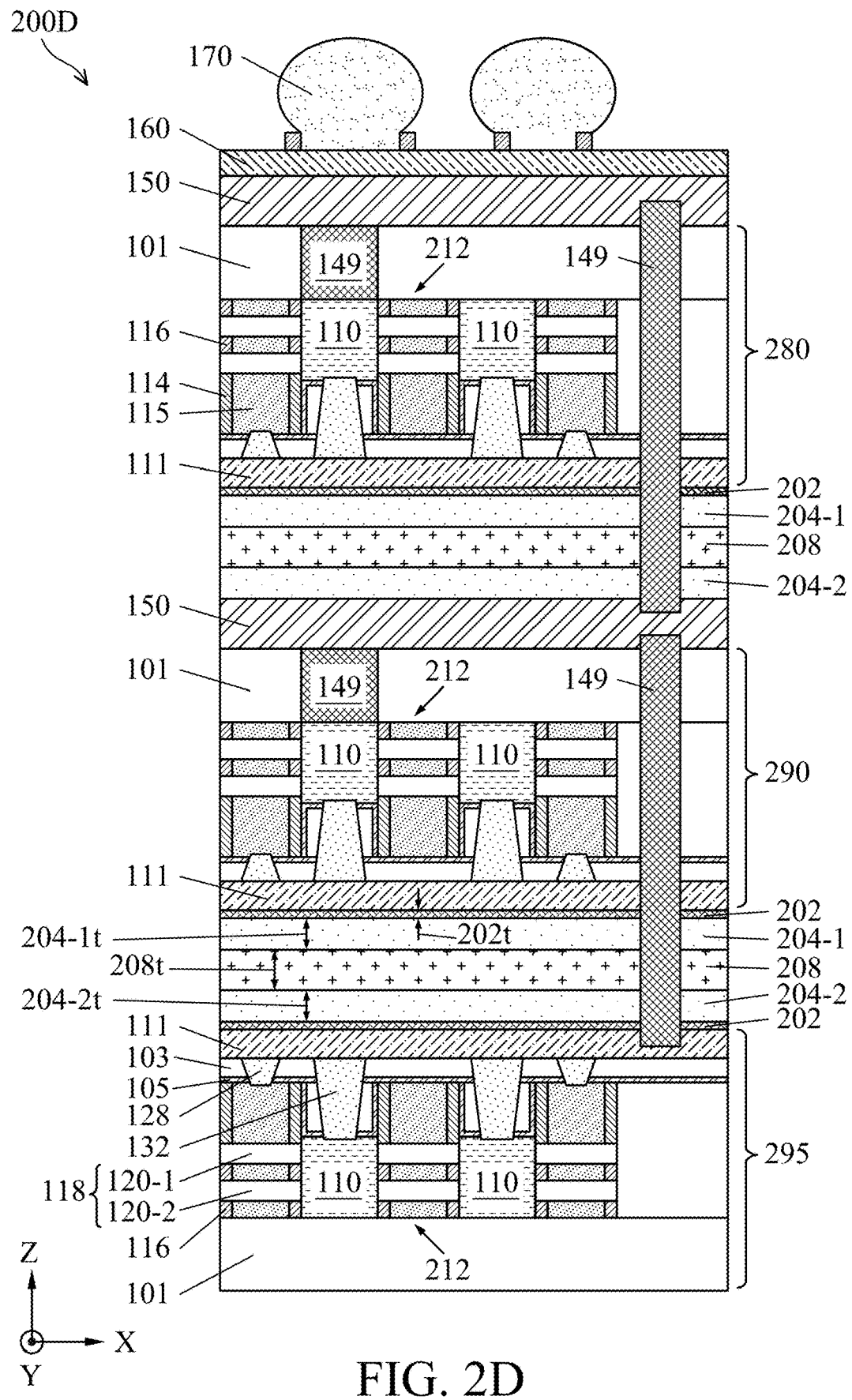
Figure 2E:
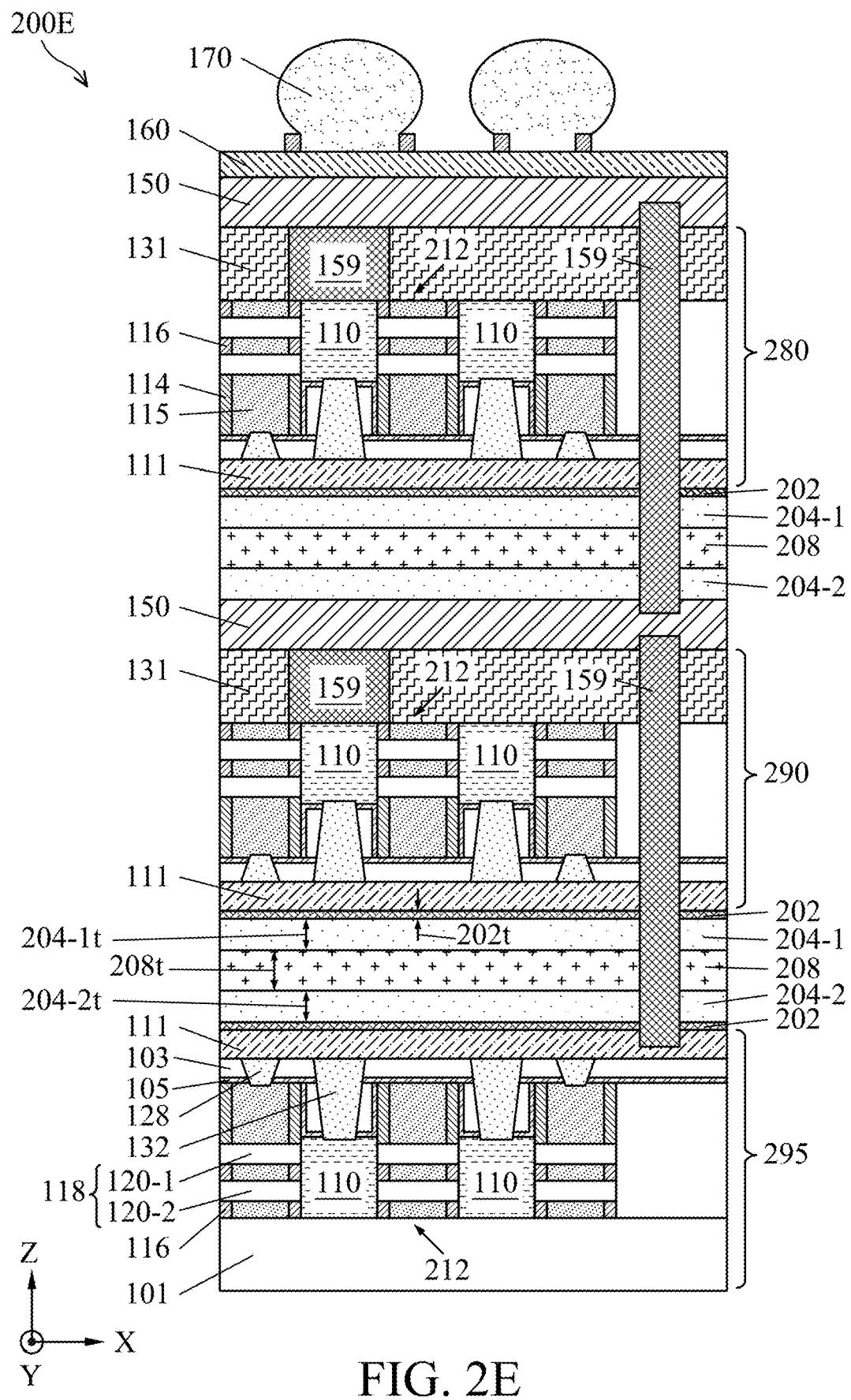

FIGS. 2A and 2B illustrate respective bonded structures 200A and 200B having a first wafer 280 bonded to a second wafer 290 with bonding layer 208 and storage layers 204-1 and 204-2, in accordance with some embodiments. FIGS. 2C-2E illustrate respective bonded structures 200C-200E having a first wafer 280 bonded to a second wafer 290 and further bonded to a third wafer 295 with bonding layer 208 and storage layers 204-1 and 204-2, in accordance with some embodiments. Elements in FIGS. 2A-2E with the same annotations as elements in FIGS. 1A-1C are described above. Referring to FIGS. 2A-2E, each of bonded structure 200A-200E can include protective layer 202, bonding layer 208, and storage layers 204-1 and 204-2. In some embodiments, one or more semiconductor devices 212 can be disposed adjacent to protective layer 202.

In some embodiments, as shown in FIG. 2A, first wafer 280 can be a device wafer having one or more semiconductor devices 212 formed on substrate 101 and second wafer 280 can also be a device wafer having one or more semiconductor devices 212 formed on an oxide layer 131. The front-side of first wafer 280 can be bonded to the front-side of second wafer 290 via bonding layer 208 and storage layers 204-1 and 204-2. TOV 159 can extend through oxide layer 131 and connect S/D epitaxial structures 110 of one or more semiconductor devices 212 to backside metal routing layer 150 and other parts of bonded structure 200A.

In some embodiments, as shown in FIG. 2B, first wafer 280 can be a device wafer having one or more semiconductor devices 212 formed on substrate 101 and second wafer 280 can also be a device wafer having one or more semiconductor devices 212 formed on substrate 101. The front-side of first wafer 280 can be bonded to the front-side of second wafer 290 via bonding layer 208 and storage layers 204-1 and 204-2. TSV 149 can extend through substrate 101 and connect S/D epitaxial structures 110 of one or more semiconductor devices 212 to backside metal routing layer 150 and other parts of bonded structure 200B.

In some embodiments, as shown in FIG. 2C, first wafer 280 can be a device wafer having one or more semiconductor devices 212 formed on substrate 101, second wafer 290 can also be a device wafer having one or more semiconductor devices 212 formed on substrate 101, and third wafer 295 can be a carrier wafer. The front-side of first wafer 280 can be bonded to the backside of second wafer 290 via bonding layer 208 and storage layers 204-1 and 204-2 and the front-side of second wafer 290 can be bonded to third wafer 295 via bonding layer 208 and storage layers 204-1 and 204-2. TSV 149 can extend through substrate 101 and connect S/D epitaxial structures 110 of one or more semiconductor devices 212 on first and second wafers 280 and 290 to backside metal routing layer 150 and other parts of bonded structure 200C.

In some embodiments, as shown in FIG. 2D, each of first, second, and third wafers 280, 290, and 295 can be a device wafer having one or more semiconductor devices 212 formed on substrate 101. The front-side of first wafer 280 can be bonded to the backside of second wafer 290 via bonding layer 208 and storage layers 204-1. The front-side of second wafer 290 can be bonded to the front-side of third wafer 295 via bonding layer 208 and storage layers 204-1 and 204-2. TSV 149 can extend through substrate 101 and connect S/D epitaxial structures 110 of one or more semiconductor devices 212 on first, second, and third wafers 280, 290, and 295 to backside metal routing layer 150 and other parts of bonded structure 200D.

In some embodiments, as shown in FIG. 2E, each of first and second wafers 280 and 290 can be a device wafer having one or more semiconductor devices 212 formed on oxide layer 131. Third wafer 295 can be a device wafer having one or more semiconductor devices 212 formed on substrate 101. The front-side of first wafer 280 can be bonded to the backside of second wafer 290 via bonding layer 208 and storage layers 204-1. The front-side of second wafer 290 can be bonded to the front-side of third wafer 295 via bonding layer 208 and storage layers 204-1 and 204-2. TOV 159 can extend through oxide layer 131 and connect S/D epitaxial structures 110 of one or more semiconductor devices 212 on first, second, and third wafers 280, 290, and 295 to backside metal routing layer 150 and other parts of bonded structure 200E.

Referring to FIGS. 2A-2E, protective layer 202 can be disposed on first, second, and third wafers 280, 290, and 295 to protect one or more semiconductor devices 212. In some embodiments, protective layer 202 can include a dielectric material similar to protective layer 102. In some embodiments, protective layer 202 can have a vertical dimension 202t (e.g., thickness) along a Z-axis direction ranging from about 1 nm to about 20 nm. Protective layer 202 can be configured to protect respective semiconductor devices 212 on first, second, and third wafers 280, 290, and 295 from damages (e.g., oxidation) in subsequent processes. The protection can be provided, for example, during formation of storage layers 104-1 and 104-2.

Referring to FIGS. 2A-2E, storage layers 204-1 and 204-2 can be disposed on first, second, and third wafers 280, 290, and 295. In some embodiments, storage layers 204-1 and 204-2 (collectively referred to as "storage layers 204") can include a carbon-containing porous material similar to storage layers 104. Storage layers 204 can store water vapor and hydrogen byproducts generated during the bonding anneal as storage layers 104. Storage layers 204 can include carbon, nitrogen, silicon, and oxygen having concentrations similar to that of storage layers 104.

In some embodiments, storage layer 204-1 can have a vertical dimension 204-1t (e.g., thickness) along a Z-axis ranging from about 20 nm to about 150 nm. In some embodiments, storage layer 204-2 can have a vertical dimension 204-2t (e.g., thickness) along a Z-axis ranging from about 20 nm to about 150 nm. Vertical dimension 204-1t can be the same as or different from vertical dimension 204-2t.

Bonding layer 208 can be in contact with storage layers 204 and bond first, second, and third wafers 280, 290, and 295. In some embodiments, bonding layer 208 can include a dielectric material similar to bonding layer 108. Bonding layer 208 can bond first, second, and third wafers 280, 290, and 295. The water vapor and hydrogen byproducts generated during the bonding anneal can be stored by storage layers 204. In some embodiments, bonding layer 208 can have a vertical dimension 208*t* (e.g., thickness) along a Z-axis ranging from about nm to about 100,000 nm.

Figure 3:
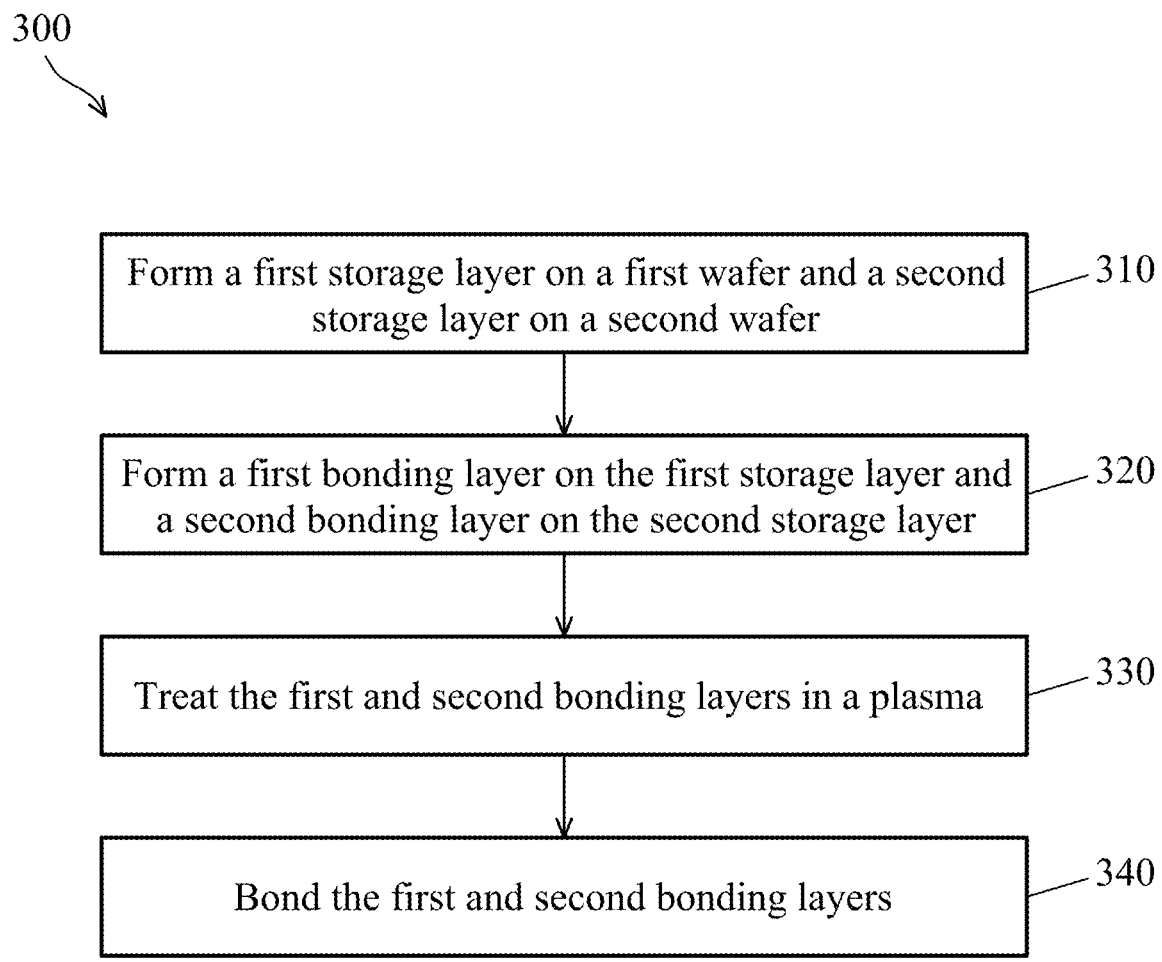
FIG. 3 is a flow diagram of a method for bonding a first wafer to a second wafer, where the first and second wafers have storage layers disposed thereon, in accordance with some embodiments.

FIG. 3 is a flow diagram of an example method 300 for bonding first wafer 180 having storage layer 104-1 and second wafer 190 having storage layer 104-2 shown in FIG. 1A, according to some embodiments. Method 300 may not be limited to the formation of bonded structure 100A and can be applicable to bonded structures 100B-100C and 200A-200E as well as other bonded structures and bonding processes. Additional fabrication operations may be performed between various operations of method 300 and may be omitted merely for clarity and ease of description. Additional processes can be provided before, during, and/or after method 300; one or more of these additional processes are briefly described herein. Moreover, not all operations may be needed to perform the disclosure provided herein. Additionally, some of the operations may be performed simultaneously or in a different order than shown in FIG. 3. In some embodiments, one or more other operations may be performed in addition to or in place of the presently described operations.

For illustrative purposes, the operations illustrated in FIG. 3 will be described with reference to the example fabrication process for bonding first and second wafers 180 and 190 as illustrated in FIGS. 4-7. FIGS. 4-7 illustrate bonded structure 100A having first wafer 180 bonded to second wafer 190 with storage layers 104-1 and 104-2 at various stages of its fabrication process, in accordance with some embodiment. Elements in FIGS. 4-7 with the same annotations as elements in FIG. 1A are described above.

Figure 4:
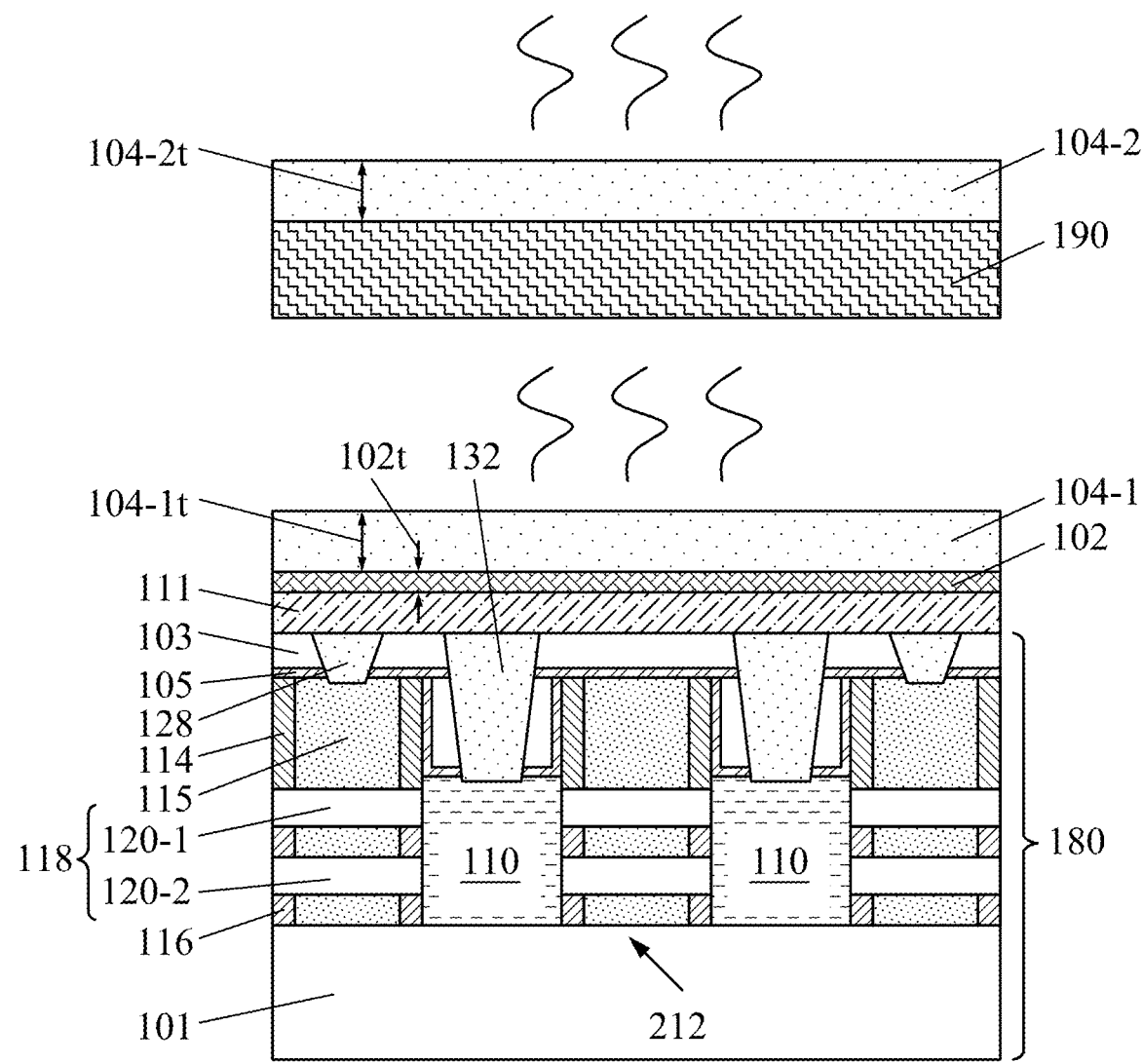
FIGS. 4-7 illustrate a bonded structure having a first wafer bonded to a second wafer at various stages of its fabrication process, where the first and second wafers have storage layers disposed thereon, in accordance with some embodiments.

In referring to FIG. 3, method 300 begins with operation 310 and the process of forming a first storage layer on a first wafer and a second storage layer on a second wafer. For example, as shown in FIG. 4, storage layer 104-1 can be formed on first wafer 180 and storage layer 104-2 can be formed on second wafer 190. In some embodiments, first wafer 180 can be a device wafer having one or more semiconductor devices 112 formed on substrate 101 and second wafer 190 can be a carrier wafer having a substrate. The formation of one or more semiconductor devices 112 can include the formation of fin structures 118, the formation of inner spacer structures 116, the formation of S/D epitaxial structures 110, and the formation of gate structures 115. The formation of one or more semiconductor devices 112 can be followed by the formation of gate contact structures 128, the formation of front-side S/D contact structures 132, and the formation of interconnect layer 111. Interconnect layer 111 can include one or more layers of metal vias and metal lines disposed on ILD layers 103. ESL 105 can be disposed between adjacent ILD layers 103. Prior to the formation of storage layer 104-1 on first wafer 180, protective layer 102 can be formed on first wafer 180. The fabrication operations to form first wafer 180 as a device wafer having one or more semiconductor devices 112 are not described in detail for ease of description.

In some embodiments, protective layer 102 can include a dielectric material, such as $SiN_x$, $SiO_x$, SiON, SiC, SiCN, BN, SiBN, SiCBN, and a combination thereof. In some embodiments, protective layer 102 can include silicon nitride or silicon oxide deposited by ALD, LPCVD, PECVD, or CVD. In some embodiments, protective layer 102 can have a vertical dimension 102*t* (e.g., thickness) along a Z-axis direction ranging from about 1 nm to about 20 nm. Protective layer 102 can be configured to protect one or more semiconductor devices 112 on first wafer 180 from damages (e.g., oxidation) in subsequent processes. This protection can be provided, for example, during formation of storage layer 104-1.

Storage layer 104-1 can be formed on protective layer 102 and storage layer 104-2 can be formed on second wafer 190. In some embodiments, storage layers 104 can include a carbon-containing porous material to store water vapor and hydrogen byproducts generated during the bonding anneal. In some embodiments, the carbon-containing porous material can be deposited on top surfaces of protective layer 102 and second wafer 190 by thermal ALD, CVD, physical vapor deposition (PVD), spin coating, and other suitable deposition methods. In some embodiments, the carbon-containing porous material can be deposited using a precursor including silicon, oxygen, and carbon mixed with a nitrogen-containing gas. The nitrogen-containing gas can include nitrogen gas ($N_2$), ammonia ($NH_3$), ammonia ion ($NH4^+$), and other nitrogen-containing elements. In some embodiments, the carbon-containing porous material can be deposited using a precursor including silicon, oxygen, and carbon without any nitrogen-containing gas.

In some embodiments, the carbon-containing porous material can be deposited with a flow rate of the nitrogen-containing gas from about 1 standard liter per minute (SLM) to about 10 SLM at a process temperature from about 300° C. to about 500° C. The flow rate and the process temperature can control the nitrogen concentration in the deposited porous material and storage layers 104. In some embodiments, the nitrogen concentration in the storage layers 104 can be controlled from about 7% to about 15%. Nitrogen in storage layers 104 can increase the etch resistance of storage layers 104 and storage layers 104 can act as etch stop layers in subsequent processes. For example, bonding layer 108 can be removed by diluted hydrofluoride acid (dHF) in subsequent processes and storage layers 104 can act as the etch stop layer. In some embodiments, bonding layer 108 and storage layers 104 can have a high etch selectivity. The term "etch selectivity" can refer to the ratio of the etch rates of two different materials under the same etching conditions. The etch selectivity between bonding layer 108 and storage layers 104 can range from about 10 to about 1000. If the flow rate of the nitrogen-containing gas is less than about 1 SLM, or the process temperature is less than about 300° C., the nitrogen concentration may be less than about 7%, and the etch selectivity between storage layers 104 and adjacent structures may be reduced. If the flow rate of the nitrogen-containing gas is greater than about 10 SLM, or the process temperature is greater than about 500° C., the nitrogen concentration may be greater than about 15%, and storage layers 104 may have lower carbon concentration and storage layers 104 may not be able to store the water vapor and hydrogen byproducts generated during subsequent bonding processes.

In some embodiments, the carbon-containing porous material can be deposited under a pressure from about 100 Pa to about 1300 Pa. The deposition pressure can control the deposition rate of the carbon-containing porous material. If the pressure is less than about 100 Pa, the deposition rate may be lower, the deposition time may be increased, and the manufacturing efficiency may be decreased. If the pressure is greater than about 1300 Pa, the deposition rate may be higher, the deposition time may be shorter, and the difficult to control the deposition of the carbon-containing material may increase.

The deposition of the carbon-containing porous material can be followed by an anneal process in an environment of oxygen and nitrogen. In some embodiments, the anneal process can be performed by a furnace anneal, a rapid thermal anneal, or other suitable anneal methods. In some embodiments, the deposited carbon-containing porous material can be annealed at an annealing temperature from about 200° C. to about 600° C. The annealing temperature can control the carbon concentration in storage layers 104. The higher the carbon concentration is, the higher the porosity of storage layers 104 is, and the lower the density of storage layers 104 is. In some embodiments, the carbon concentration in storage layers 104 can range from about 5% to about 25% and the density of storage layers 104 can range from about 1.6 g/cm$^3$ to about 2.3 g/cm$^3$. If the annealing temperature is less than about 200° C., the carbon concentration in storage layers 104 may be greater than about 25%, the density of storage layers 104 may be less than about 1.6 g/cm$^3$, storage layers 104 may have lower quality and may peel off. If the annealing temperature is greater than about 600° C., the carbon concentration in storage layers 104 may be less than about 5%, the density of storage layers 104 may be greater than about 2.3 g/cm$^3$, storage layers 104 may not be able to store the water vapor and hydrogen byproducts generated during subsequent bonding processes.

In some embodiments, a ratio of the nitrogen gas to oxygen gas during the maturing process can range from about 0.02 to about 1. The ratio of the nitrogen gas to oxygen gas can control the oxygen concentration in storage layers 104 and tune the dielectric constant of storage layers 104. In some embodiments, the oxygen concentration in storage layers 104 can range from about 20% to about 60% and the dielectric constant of storage layers 104 can range from about 3.7 to about 4.3. If the ratio of the nitrogen gas to oxygen gas is less than about 0.02 during the maturing process, the oxygen concentration in storage layers 104 may be greater than about 60%, and carbon contraction may be reduced and storage layers 104 may not be able to store the water vapor and hydrogen byproducts generated during subsequent bonding processes. If the ratio of the nitrogen gas to oxygen gas is greater than about 1 during the maturing process, the oxygen concentration in storage layers 104 may be less than about 20%, the dielectric constant of storage layers 104 may increase, and parasitic capacitance of bonded structure 100 may increase.

After the deposition of carbon-containing porous material and the maturing process, storage layers 104-1 and 104-2 can be formed on first wafer 180 and second wafer 190, respectively. In some embodiments, storage layer 104-1 can have a vertical dimension 104-1$t$ (e.g., thickness) along a Z-axis ranging from about 20 nm to about 150 nm. In some embodiments, storage layer 104-2 can have a vertical dimension 104-2$t$ (e.g., thickness) along a Z-axis ranging from about 5 nm to about 150 nm.

Figure 5:
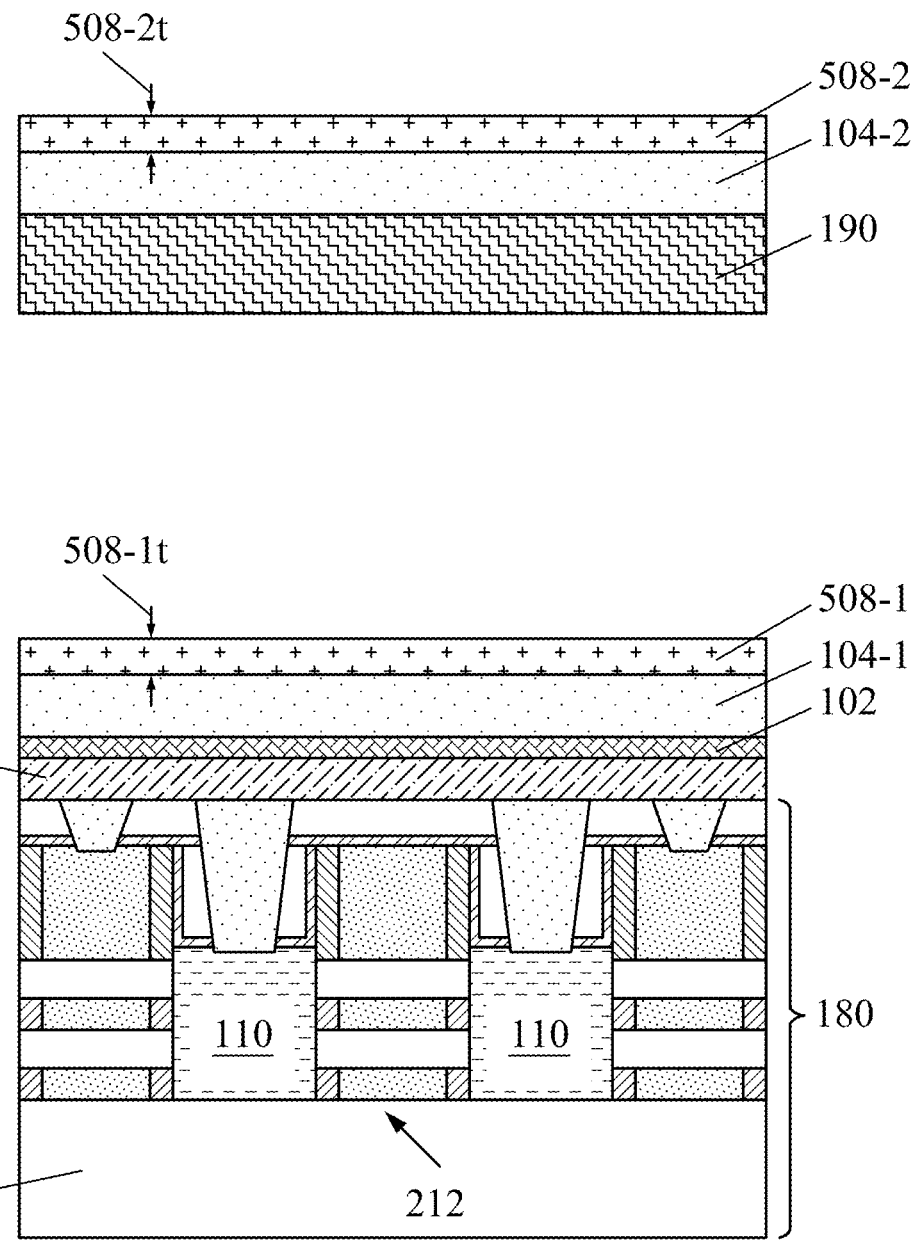

Referring to FIG. 3, in operation 320, a first bonding layer is formed on the first storage layer and a second bonding layer is formed on the second storage layer. For example, as shown in FIG. 5, bonding layer 508-1 can be formed on storage layer 104-1 and bonding layer 508-2 can be formed on storage layer 104-2. Bonding layers 508-1 and 508-2 (collectively referred to as "bonding layers 508") can be formed by depositing a layer of dielectric material. In some embodiments, bonding layers 508 can be deposited by ALD, CVD, PECVD, high density plasma (HDP), flowable chemical vapor deposition (FCVD), or other suitable deposition methods. In some embodiments, bonding layer 108 can include a dielectric material, such as SiO$_x$, SiOH, SiON, SiN$_x$, SiOC, SiOCN, and a combination thereof. In some embodiments, bonding layer 508-1 can have a vertical dimension 508-1$t$ (e.g., thickness) along a Z-axis ranging from about 5 nm to about 100,000 nm. In some embodiments, bonding layer 508-2 can have a vertical dimension 508-2$t$ (e.g., thickness) along a Z-axis ranging from about 5 nm to about 100,000 nm.

Figure 6:
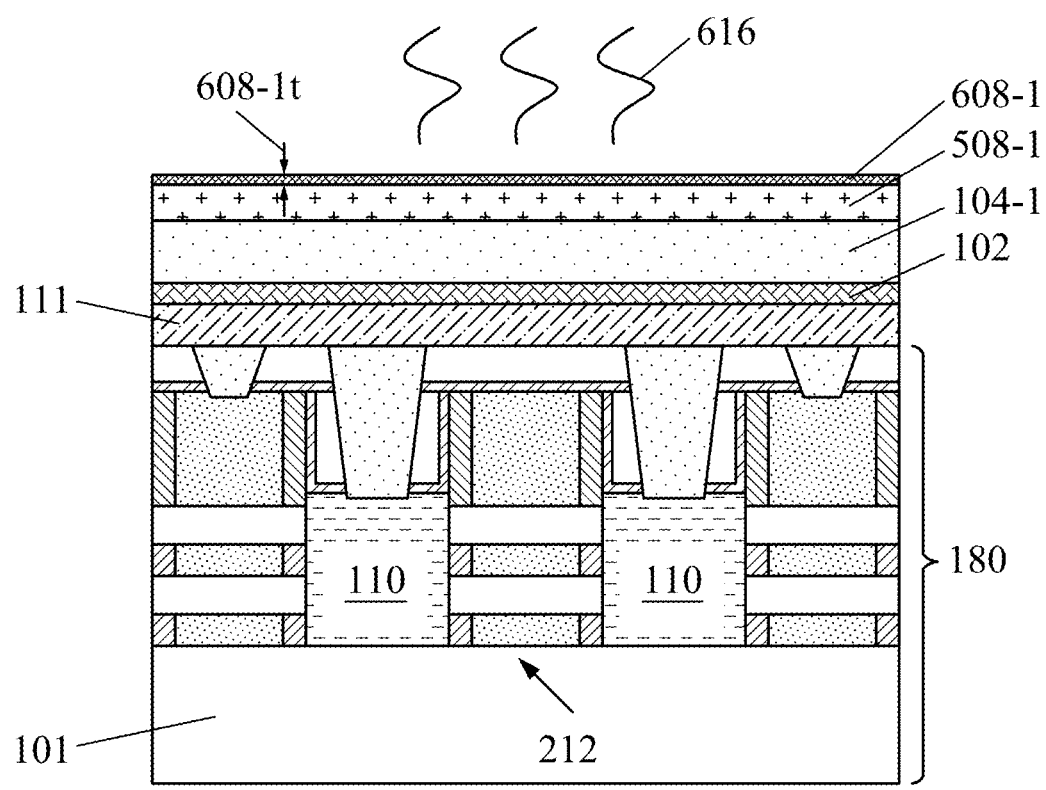

In operation 330 of FIG. 3, the first bonding layer and the second bonding layer are treated in a plasma. For example, as shown in FIG. 6, bonding layers 508-1 and 508-2 can be treated in a plasma 616. The plasma treatment can follow the deposition of bonding layers 508-1 and 508-2. In some embodiments, top surfaces of bonding layers 508-1 and 508-2 can be treated in a direct plasma to activate the top surfaces for bonding. The plasma treatment can be performed at a room temperature under a pressure from about 0.001 mbar to about 0.1 mbar. The plasma can be generated from gases including hydrogen, nitrogen, and/or oxygen. The plasma treatment can include a top electrode having a power from about 30 W to about 125 W and a bottom electrode having a power from about 10 W to about 100 W. After the plasma treatment, intermediate layers 608-1 and 608-2 can be formed on bonding layers 508-1 and 508-2, respectively. In some embodiments, intermediate layers 608-1 and 608-2 can include a dielectric material, such as SiOH. In some embodiments, intermediate layers 608-1 and 608-2 can have respective vertical dimensions 608-1$t$ and 608-2$t$ (e.g., thickness) along a Z-axis ranging from about 5 Å to about 20 Å. Intermediate layers 608-1 and 608-2 can react and fuse together in subsequent bonding anneal process. As a result, the bonding process can also be referred to as "fusion bonding."

Figure 7:
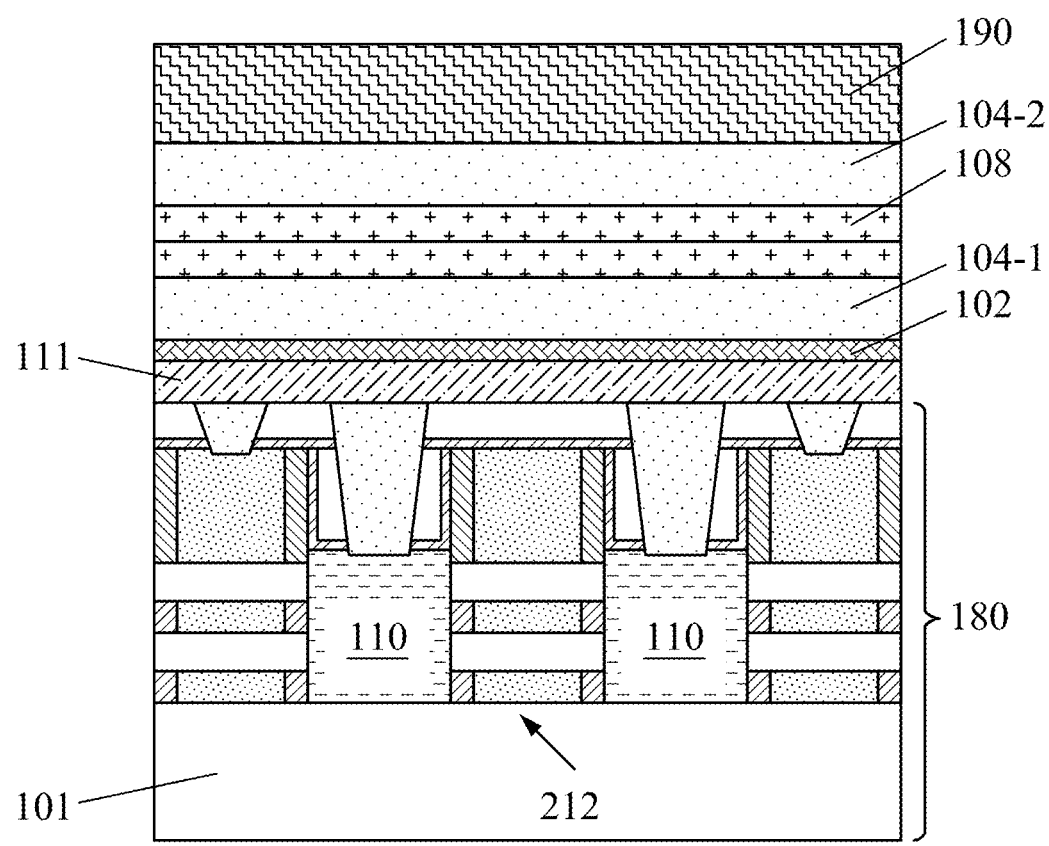

In operation 340 of FIG. 3, the first bonding layer and the second bonding layer are bonded. For example, as shown in FIG. 7, bonding layers 508-1 and 508-2 can be bonded together and form bonding layer 108. The plasma treatment of top surfaces of bonding layers 508-1 and 508-2 can be followed by annealing plasma treated bonding layers 508-1 and 508-2, as shown in FIG. 7. In some embodiments, second wafer 190 can be flipped upside down and placed on top of first wafer 180. As a result, intermediate layers 608-1 and 608-2 formed after plasma treatment of bonding layers 508-1 and 508-2 can be in contact. In some embodiments, the stacked first and second wafers 180 and 190 can be annealed at a temperature from about 300° C. to about 600° C. to bond first and second wafers 180 and 190. In some embodiments, during the bonding anneal, intermediate layers 608-1 and 608-2 can include SiOH and react according to following equations:

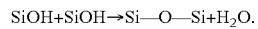

$$SiOH + SiOH \rightarrow Si-O-Si + H_2O.$$

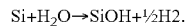

$$Si + H_2O \rightarrow SiOH + \tfrac{1}{2}H_2.$$

As shown in above equations, water vapor and hydrogen byproducts can be generated during the bonding anneal. In some embodiments, the water vapor and hydrogen byproducts can be stored the in storage layers 104-1 and 104-2 to avoid creating bubbles and stress in bonded structure 100 and causing wafer cracking issues. If the bonding anneal temperature is less than about 300° C., intermediate layers 608-1 and 608-2 may not react and first and second wafers 180 and 190 may not be stably bonded together. If the bonding anneal temperature is greater than about 600° C., semiconductor devices on first wafer 180 may be damaged and device performance may degrade. In some embodiments, compared to bonded structures without storage layers, bonded structure 100 with storage layers can reduce wafer cracking issues from a percentage of about 30% to about 80% to a percentage less than about 5%.

The formation of bonding layer 108 can be followed by the formation of backside S/D contact structures 136, backside ILD layer 148, backside metal routing layer 150, backside metal contact layer 160, and bump contacts 170, which are shown in FIG. 1A. The fabrication operations are not described in details merely for ease of description.

Though the present disclosure describes bonding first wafer 180 and second wafer 190 with storage layers 104, the methods of bonding wafers with storage layers can be applied to first, second, and third wafers 280, 290 and 295 and other suitable structures. Though the present disclosure illustrates bonded structures 100A-100C and 200A-200E having two and three bonded wafers, bonded structures having more than three wafers bonded with storage layers 104 can be fabricated for 3D IC.

Various embodiments in the present disclosure provide example methods for forming bonded structures 100A-100C and 200A-200E using storage layers 104 and 204, respectively. According to some embodiments, storage layers 104 and 204 can store the water vapor and hydrogen byproducts generated during the bonding anneal, thereby reducing wafer cracking issues. In some embodiments, storage layers 104 and 204 can include a carbon-containing porous material to store the water vapor and hydrogen byproducts. The carbon concentration in storage layers 104 and 204 can range from about 5% to about 25%. In some embodiments, storage layers 104 and 204 can further include nitrogen to act as an etch stop layer for subsequent processes. The nitrogen concentration in storage layers 104 and 204 can range from about 7% to about 15%. In some embodiments, storage layers 104 and 204 can include silicon, oxygen, carbon, and nitrogen. And the dielectric constant of storage layers 104 and 204 can be adjusted by tuning the oxygen concentration and/or the carbon concentration. In some embodiments, storage layers 104 and 204 can reduce the percentage of wafer cracking issues for bonded structures to less than about 5%.

In some embodiments, a semiconductor device includes a first wafer including a first storage layer with carbon, a second wafer including a second storage layer with carbon, and a bonding layer interposed between the first and second wafers and in contact with the first and second storage layers.

In some embodiments, a semiconductor device includes a device wafer and a carrier wafer. The device wafer includes a first storage layer with carbon and multiple devices. The carrier wafer includes a second storage layer with carbon. The semiconductor device further includes a protective layer, on the device wafer, to protect the multiple devices. The semiconductor device further includes a bonding layer interposed between the first and second storage layers.

In some embodiments, a method includes forming a first storage layer on a first wafer and a second storage layer on a second wafer, forming a first bonding layer on the first storage layer and a second bonding layer on the second wafer, treating the first and second bonding layers in a plasma, and bonding the first and second storage layers. The first and second storage layers include carbon.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first storage layer on a first wafer and a second storage layer on a second wafer;
   forming a first bonding layer on the first storage layer of the first wafer and a second bonding layer on the second storage layer of the second wafer;
   treating the first and second bonding layers in a plasma; and
   bonding the first and second wafers via the treated first and second bonding layers, wherein the bonded first and second bonding layers are in contact with the first and second storage layers.

2. The method of claim 1, further comprising forming a protective layer on the first wafer before forming the first storage layer, wherein the protective layer protects one or more semiconductor devices on the first wafer.

3. The method of claim 1, wherein the forming the first and second storage layers comprises:
   depositing a layer of carbon-containing porous material on the first and second wafers; and
   annealing the layer of carbon-containing porous material in an environment of oxygen and nitrogen.

4. The method of claim 3, wherein the depositing the layer of carbon-containing porous material comprises depositing the layer of carbon-containing porous material using a nitrogen-containing gas and a precursor including silicon, oxygen, and carbon.

5. The method of claim 3, wherein the annealing the layer of carbon-containing porous material comprises treating the layer of carbon-containing porous material under a temperature ranging from about 200° C. to about 600° C.

6. The method of claim 1, wherein the forming the first and second bonding layers comprises depositing a layer of dielectric material on the first and second storage layers, respectively.

7. The method of claim 1, wherein the treating the first and second bonding layers in the plasma comprises forming an intermediate layer on the first and second bonding layers.

8. The method of claim 1, wherein the bonding the first and second storage layers comprises:
   placing the second wafer on top of the first wafer, wherein the treated first bonding layer is in contact with the treated second bonding layer; and
   annealing the treated first and second bonding layers.

9. The method of claim 1, further comprising forming a contact structure on the first wafer, wherein the contact structure and the first and second storage layers are on opposite sides of the first wafer.

10. A method, comprising:
    depositing a layer of carbon-containing porous material on first and second wafers, wherein the first wafer comprises one or more semiconductor devices;
    depositing a layer of dielectric material on the layer of carbon-containing porous material;

treating a top surface of the layer of dielectric material with a plasma; and bonding the first and second wafers via the treated layer of dielectric material.

11. The method of claim 10, further comprising forming a protective layer on the first wafer before depositing the layer of carbon-containing porous material, wherein the protective layer protects the one or more semiconductor devices on the first wafer.

12. The method of claim 10, wherein the depositing the layer of carbon-containing porous material comprises depositing the layer of carbon-containing porous material using a nitrogen-containing gas and a precursor including silicon, oxygen, and carbon.

13. The method of claim 10, further comprising annealing the layer of carbon-containing porous material in an environment of oxygen and nitrogen.

14. The method of claim 10, wherein the treating the top surface of the layer of dielectric material with the plasma comprise forming an intermediate layer on the top surface of the layer of dielectric material.

15. The method of claim 10, wherein the bonding the first and second wafers comprises:
placing the second wafer on top of the first wafer, wherein the treated layer of dielectric material on the first wafer is in contact with the treated layer of dielectric material on the second wafer; and
annealing the treated layer of dielectric material.

16. A method, comprising:
forming one or more semiconductor devices on a first wafer;
forming a protective layer on the first wafer to protect the one or more semiconductor devices;
forming a first storage layer on the protective layer;
forming a second storage layer on a second wafer;
forming a first bonding layer on the first storage layer and a second bonding layer on the second storage layer; and
bonding the first and second wafers via the first and second bonding layers.

17. The method of claim 16, wherein the forming the first storage layer comprises:
depositing a layer of carbon-containing porous material on the protective layer; and
annealing the layer of carbon-containing porous material in an environment of oxygen and nitrogen.

18. The method of claim 16, wherein the forming the first and second bonding layers comprises depositing a layer of dielectric material on the first and second storage layers, respectively.

19. The method of claim 16, further comprising treating the first and second bonding layers in a plasma to form an intermediate layer on the first and second bonding layers.

20. The method of claim 19, wherein the bonding the first and second wafers comprises:
placing the second wafer on top of the first wafer, wherein the intermediate layer on the first bonding layer is in contact with the intermediate layer on the second bonding layer; and
annealing the first and second wafers to fuse the intermediate layer on the first and second bonding layers.

* * * * *